United States Patent
Wei et al.

(10) Patent No.: US 7,843,002 B2
(45) Date of Patent: Nov. 30, 2010

(54) FULLY ISOLATED HIGH-VOLTAGE MOS DEVICE

(75) Inventors: Chi-San Wei, Hsinchu (TW); Kuo-Ming Wu, Hsinchu (TW); Yi-Chun Lin, Shalu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 774 days.

(21) Appl. No.: 11/773,365

(22) Filed: Jul. 3, 2007

(65) Prior Publication Data

US 2009/0008711 A1    Jan. 8, 2009

(51) Int. Cl.
*H01L 21/00* (2006.01)

(52) U.S. Cl. .................. 257/335; 257/337; 257/347; 257/355; 257/369; 257/407; 257/E21.375; 257/E21.696; 257/E27.063; 257/E27.069; 257/E29.258

(58) Field of Classification Search ......... 257/335–407, 257/492, 493, E21.375, 696, 27.017, 63–69, 257/E29.027, 256–258, 345
See application file for complete search history.

(56) References Cited

U.S. PATENT DOCUMENTS

| | | | |
|---|---|---|---|
| 5,248,624 A | 9/1993 | Icel et al. | |
| 5,648,281 A * | 7/1997 | Williams et al. | 438/358 |
| 5,943,564 A * | 8/1999 | Chen et al. | 438/202 |
| 6,265,752 B1 * | 7/2001 | Liu et al. | 257/487 |
| 6,677,210 B1 * | 1/2004 | Hebert | 438/301 |
| 7,411,271 B1 * | 8/2008 | Ma et al. | 257/547 |
| 7,482,662 B2 * | 1/2009 | Wu et al. | 257/401 |
| 7,514,754 B2 * | 4/2009 | Ma et al. | 257/370 |
| 7,602,037 B2 * | 10/2009 | Lin et al. | 257/492 |
| 2003/0134479 A1 | 7/2003 | Salling et al. | |
| 2006/0011985 A1 * | 1/2006 | Cai et al. | 257/369 |
| 2006/0220130 A1 * | 10/2006 | Sato et al. | 257/347 |
| 2007/0034956 A1 * | 2/2007 | Lee et al. | 257/355 |
| 2007/0120184 A1 * | 5/2007 | Cai et al. | 257/335 |
| 2008/0265292 A1 * | 10/2008 | Huang et al. | 257/288 |

* cited by examiner

*Primary Examiner*—Michael S Lebentritt
(74) *Attorney, Agent, or Firm*—Slater & Matsil, L.L.P.

(57) ABSTRACT

A semiconductor structure includes a semiconductor substrate; an n-type tub extending from a top surface of the semiconductor substrate into the semiconductor substrate, wherein the n-type tub comprises a bottom buried in the semiconductor substrate; a p-type buried layer (PBL) on a bottom of the tub, wherein the p-type buried layer is buried in the semiconductor substrate; and a high-voltage n-type metal-oxide-semiconductor (HVNMOS) device over the PBL and within a region encircled by sides of the n-type tub.

20 Claims, 7 Drawing Sheets

FULLY ISOLATED HIGH-VOLTAGE MOS DEVICE

TECHNICAL FIELD

This invention relates generally to high-voltage metal-oxide-semiconductor (HVMOS) devices, and more particularly to the isolation of HVMOS devices.

BACKGROUND

High-voltage metal-oxide-semiconductor (HVMOS) devices are widely used in many electrical applications, such as CPU power supplies, power management systems, AC/DC converters, etc.

Figure 1:
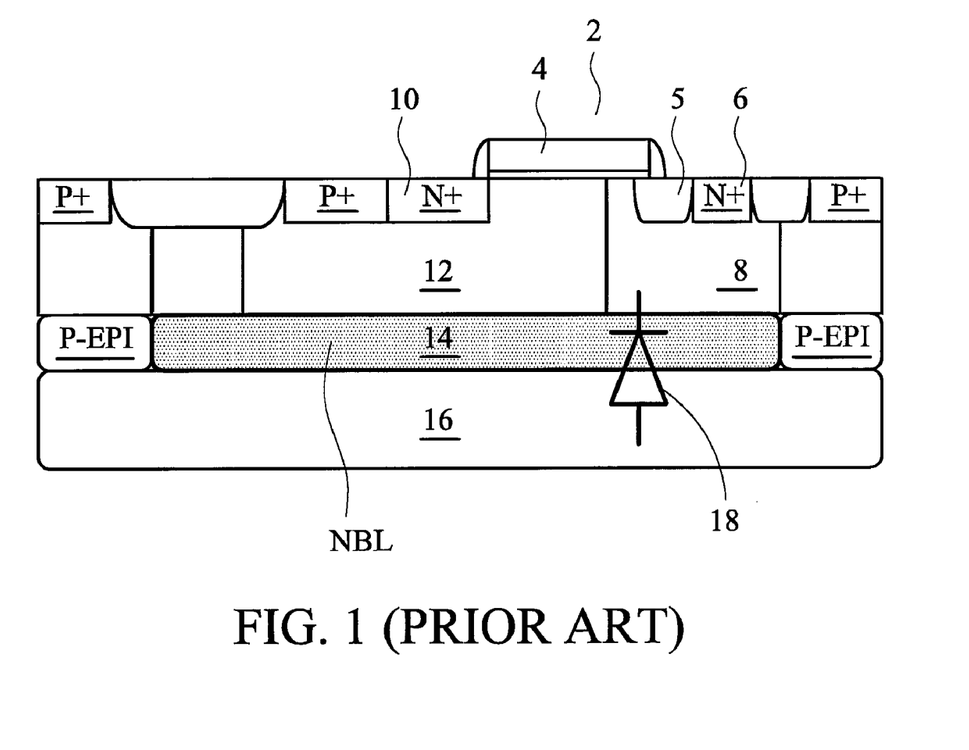
FIG. 1 illustrates a conventional high-voltage n-type MOS device.

FIG. 1 illustrates a conventional n-type HVMOS (HVN-MOS) device 2 formed over substrate 16. HVNMOS device 2 includes gate electrode 4, drain region 6 in high-voltage n-well (HVNW) 8, and source region 10 in high-voltage p-well (HVPW) 12. Shallow trench isolation (STI) region 5 spaces drain region 6 and gate electrode 4 apart, so that high drain-gate voltages can be applied. HVNMOS device 2 is formed on an n-type buried layer (NBL) 14, which is further formed on p-type substrate 16.

The conventional HVNMOS device 2 suffers drawbacks when used in certain applications. For example, power IC or driver IC may be involved with negative voltages. Therefore, when used in power IC or driver IC, HVNMOS device 2 may have negative source-to-substrate voltages and/or negative drain-to-substrate voltages. In such a case, a forward bias is applied on diode 18, which is formed of p-type substrate 16 and n-type NBL 14. The n-type NBL 14 is further connected to n-type HVNW region 8 and N+ drain region 6. Therefore, diode 18 will be turned on by negative drain-to-substrate voltages. This adversely causes the increase in leakage current, and possibly the reduction in breakdown voltage of HVNMOS device 2.

What is needed in the art, therefore, is a HVMOS device with good performance when positive source-to-substrate and drain-to-substrate voltages are applied, and is also capable of performing well for negative source-to-substrate and drain-to-substrate voltages.

SUMMARY OF THE INVENTION

In accordance with one aspect of the present invention, a semiconductor structure includes a semiconductor substrate; an n-type tub extending from a top surface of the semiconductor substrate into the semiconductor substrate, wherein the n-type tub comprises a bottom buried in the semiconductor substrate; a p-type buried layer (PBL) on a bottom of the tub, wherein the p-type buried layer is buried in the semiconductor substrate; and a high-voltage n-type metal-oxide-semiconductor (HVNMOS) device over the PBL and within a region encircled by sides of the n-type tub.

In accordance with another aspect of the present invention, a semiconductor structure includes a semiconductor substrate; a first high-voltage n-well (HVNW) region in the semiconductor substrate; a second HVNW region in the semiconductor substrate, wherein the first and the second HVNW regions are parallel; a third HVNW region between the first and the second HVNW regions; a first high-voltage p-well (HVPW) region between the first and the second HVNW regions; a first and a second n-type isolation (N-ISO) region underlying and adjoining the first and the second HVNW regions, respectively; an n-type buried layer (NBL) connecting the first and the second N-ISO regions; and a PBL on the NBL.

In accordance with yet another aspect of the present invention, a semiconductor structure includes a semiconductor substrate of a p-type conductivity; an epitaxial layer on the semiconductor substrate; an n-type buried layer (NBL) extending from the semiconductor substrate into the epitaxial layer; a PBL on the NBL; an N-ISO ring extending from the semiconductor substrate into the epitaxial layer, wherein the N-ISO ring encircles and adjoins the NBL and at least a portion of the PBL; a HVNW ring on and adjoining the N-ISO ring; and a HVNMOS device over the PBL, wherein a portion of the HVNMOS device in the epitaxial layer is encircled by the HVNW ring.

In accordance with yet another aspect of the present invention, a method of forming a semiconductor structure includes providing a semiconductor substrate having a p-type conductivity; forming an epitaxial layer on the semiconductor substrate; forming an NBL extending from the semiconductor substrate into the epitaxial layer; forming a PBL on the NBL; forming an N-ISO ring extending from the semiconductor substrate into the epitaxial layer, wherein the N-ISO ring encircles and adjoins the NBL; forming a HVNW ring on and substantially overlapping the N-ISO ring; and forming a HVNMOS device over the PBL, wherein a portion of the HVNMOS in the epitaxial layer is encircled by the HVNW ring.

In accordance with yet another aspect of the present invention, a method of forming a semiconductor structure includes providing a semiconductor substrate having a p-type conductivity; forming an NBL in the semiconductor substrate; forming a PBL in the semiconductor substrate, wherein the NBL and the PBL substantially overlap; forming an N-ISO ring in the semiconductor substrate, wherein the N-ISO ring encircles and substantially adjoins the NBL and the PBL; epitaxially growing an epitaxial layer on the semiconductor substrate, wherein the PBL, the NBL and the N-ISO ring diffuse into the epitaxial layer, and wherein the PBL is on the NBL after the step of epitaxially growing; forming a HVNW ring on and adjoining all sides of the N-ISO ring; and forming a HVNMOS device over the PBL, wherein a portion of the HVNMOS in the epitaxial layer is encircled by the HVNW ring.

The embodiments of the present invention can sustain both positive and negative source/drain-to-substrate voltages.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A through 9 are cross-sectional views of intermediate stages in the manufacturing of embodiments of the present invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments of the present invention are described with reference to FIGS. 2A through 10. Throughout the various views and illustrative embodiments of the present invention, like reference numbers are used to designate like elements.

Figure 2A:
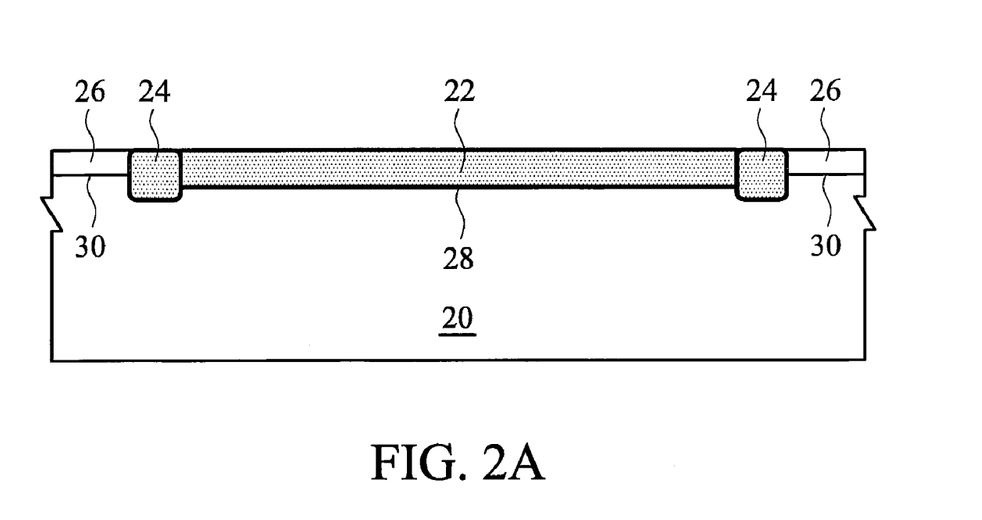
Figure 2B:
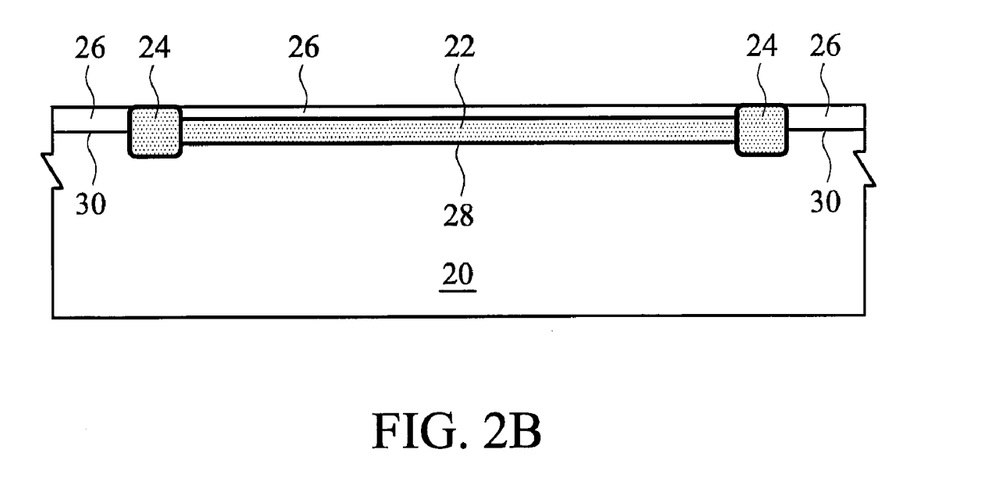

Referring to FIGS. 2A and 2B, substrate 20 is provided. Substrate 20 preferably includes a semiconductor material such as bulk silicon, although other semiconductor materials and structures such as silicon germanium (SiGe) and silicon-on-insulator (SOI) may also be used. Substrate 20 is preferably lightly doped with a p-type impurity.

Implantations are performed to substrate 20, forming doped layers. A photo resist (not shown) is formed and patterned, and an n-type buried layer (NBL) 22 is formed by implanting an n-type impurity, for example, phosphorous, antimony and/or arsenic, into substrate 20. In an exemplary embodiment, the implantation has a dosage of between about $10^{14}/cm^2$ to about $10^{16}/cm^2$. The photo resist is then removed.

N-type isolation regions 24, also referred to as N-ISO regions 24, are also formed by an implantation, wherein a photo resist may be formed to define the boundaries of N-ISO regions 24. Although N-ISO regions 24 are shown as two separated regions, in a top view, N-ISO regions 24 form a ring (refer to FIG. 10). Preferably, N-ISO regions 24 at least substantially adjoin, and preferably have portions overlapping, NBL 22.

P-type buried layer (PBL) 26 is also implanted, and the implanted impurities preferably include boron. In the preferred embodiment, PBL 26 is blanket formed. The impurity dosage of PBL 26 is preferably lower than the impurity dosage of NBL 22. In an exemplary embodiment, the dosage for implanting PBL 26 is between about $10^{13}/cm^2$ and about $10^{15}/cm^2$. PBL 26 preferably has a lower impurity concentration than N-ISO region 24. In an exemplary embodiment, the implantation dosage for forming N-ISO region 24 is greater than 2 times the dosage for implanting PBL 26. A bottom surface 28 of NBL 22 is preferably lower than a bottom surface 30 of PBL 26. This may be achieved by adjusting, and increasing if necessary, the implantation energy of NBL 22. More preferably, NBL 22 is substantially buried into substrate 20, as is shown in FIG. 2B. However, one skilled in the art will realize that it is inevitable that NBL will distribute all the way up to the surface of substrate 20. However, the majority of the implanted impurity is concentrated in a sheet as shown in FIG. 2B. The implantations of NBL 22, N-ISO regions 24 and PBL 26 may be performed in any order.

Figure 3:
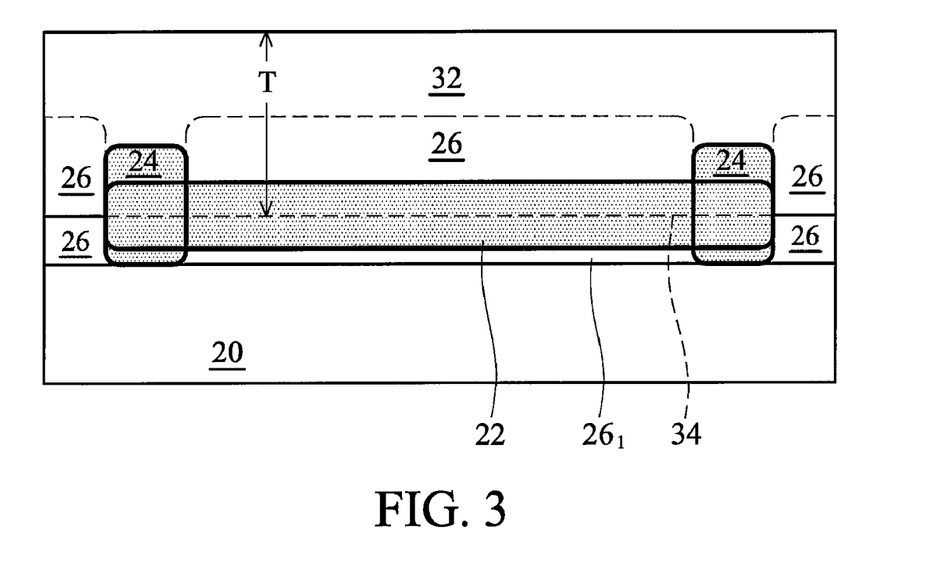

FIG. 3 illustrates the epitaxial growth of epitaxial layer 32 on substrate 20. Epitaxial layer 32 is preferably formed of a semiconductor material such as silicon, and can be the same or different from the material in substrate 20. Dotted line 34 schematically illustrates an interface between substrate 20 and epitaxial layer 32. Epitaxial layer 32 may be either un-doped, or lightly doped with a p-type impurity, which is preferably in-situ doped while the epitaxial growth proceeds. The thickness T of epitaxial layer 32 is substantially greater than the thickness of subsequently formed high voltage p-type and n-type well regions. In an exemplary embodiment, the thickness T of epitaxial layer 32 is greater than about 2 nm.

Since the epitaxial growth is performed at an elevated temperature, NBL 22, N-ISO regions 24 and PBL 26 out-diffuse into epitaxial layer 32. Due to the relatively high impurity concentration in N-ISO regions 24, the top surfaces of the diffused N-ISO regions 24 are substantially higher the top surface of the diffused NBL 22. NBL 22 is likely to have a higher impurity concentration than in PBL 26 due to its smaller diffusion length (and hence ions are more concentrated), and further due to the higher implantation dosage of NBL 22 than PBL 26. Furthermore, since boron has a greater diffusion distance than n-type impurities, PBL 26 extends further into epitaxial layer 32 than NBL 22. As a result, PBL 26 resides on NBL 22. PBL 26 may also extend below NBL 22. Accordingly, between p-type substrate 20 and NBL 22, there is a p-type region $26_1$ having a higher impurity concentration than substrate 20. The bottom surface of PBL 26 may be higher or lower then the bottom surface of N-ISO regions 24.

Figure 4:
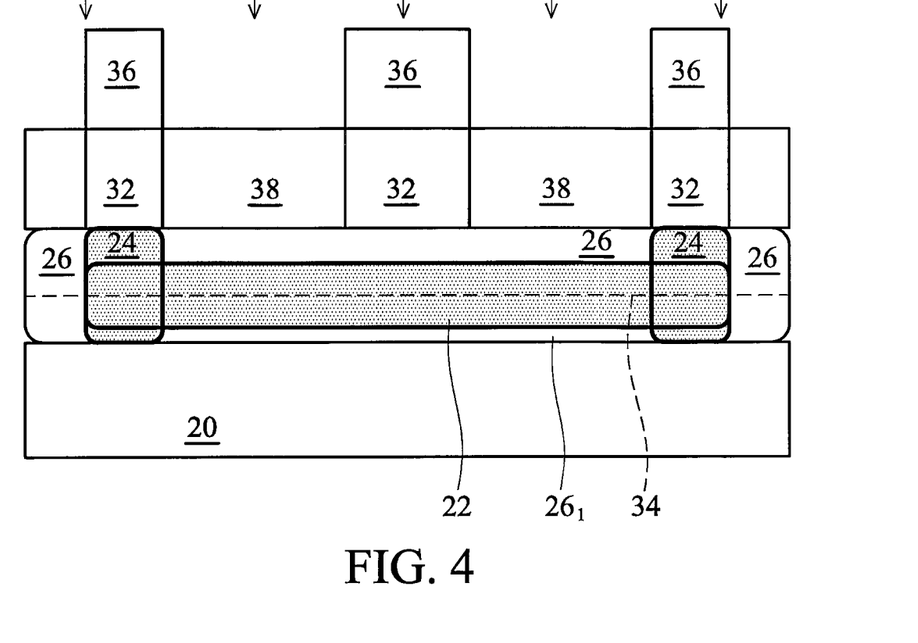

Referring to FIG. 4, photo resist 36 is formed and patterned using lithography techniques. A p-type impurity implantation is then performed in order to form p-well regions 38, also equally referred to as high-voltage p-well (HVPW) regions 38. HVPW regions 38 may be implanted with boron and/or indium. After the implantation, HVPW regions 38 may have an impurity concentration of between about $10^{15}/cm^3$ and about $10^{16}/cm^3$. The bottoms of HVPW regions 38 join PBL 26. Photo resist 36 is then removed.

Figure 5:
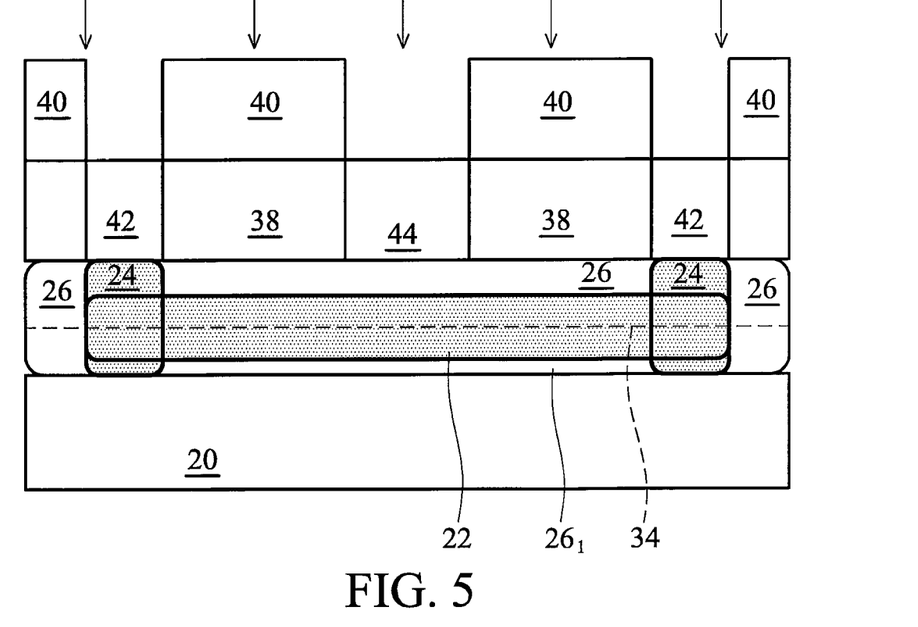

Referring to FIG. 5, photo resist 40 is formed and patterned. An n-type impurity implantation is then performed, forming n-well regions 42 and 44, which are equally referred to as high-voltage n-well (HVNW) regions. HVNW regions 42 and 44 may be implanted with phosphorous, antimony and/or arsenic, which neutralizes the p-type impurities in PBL 26 (and epitaxial layer 32, if it is in-situ doped) and converts the implanted region to n-type. HVNW regions 42 and 44 and N-ISO regions 24 may comprise the same, or different impurities. In an exemplary embodiment, after the implantation, HVNW regions 42 and 44 may have a net n-type impurity concentration of between about $10^{15}/cm^3$ and about $10^{16}/cm^3$. The bottoms of the HVNW regions 42 join N-ISO regions 24. Similar to N-ISO regions 24, although HVNW regions 42 look like two separated regions in the illustrated plane, they also formed a ring (refer to FIG. 10). HVNW regions 42 preferably have same widths as, and substantially co-terminus with N-ISO regions 24. Alternatively, N-ISO regions 24 and HVNW regions 42 have substantially different widths. Photo resist 40 is then removed.

N-ISO regions 24, HVNW regions 42 and NBL 22 form a tub. PBL 26 is located on the bottom of the tub. This structure advantageously isolates the subsequently formed HVMOS devices in the tub.

Figure 6:
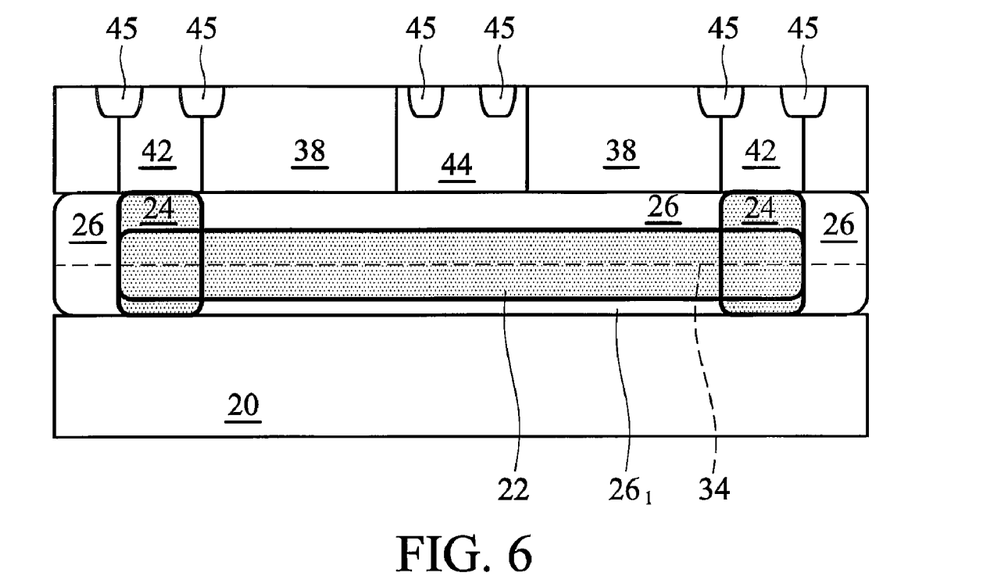

FIG. 6 illustrates the formation of shallow trench isolation (STI) regions 45. In the preferred embodiment, STI regions 45 are formed by forming trenches in the epitaxial layer 32; filling the trench with a dielectric material, such as $SiO_2$ or other high-density plasma (HDP) oxides; and performing a chemical mechanical polish to level the surface. In other embodiments, local oxidation of silicon (LOCOS) may be used to form field oxides at the same locations as STI regions 45. The process steps for forming field oxides may include forming a mask layer over HVPW regions 38 and HVNW regions 42 and 44, patterning the mask layer to form openings, and performing an oxidation. Field oxides are thus formed through the openings of the mask layer. The mask layer is then removed.

Figure 7:
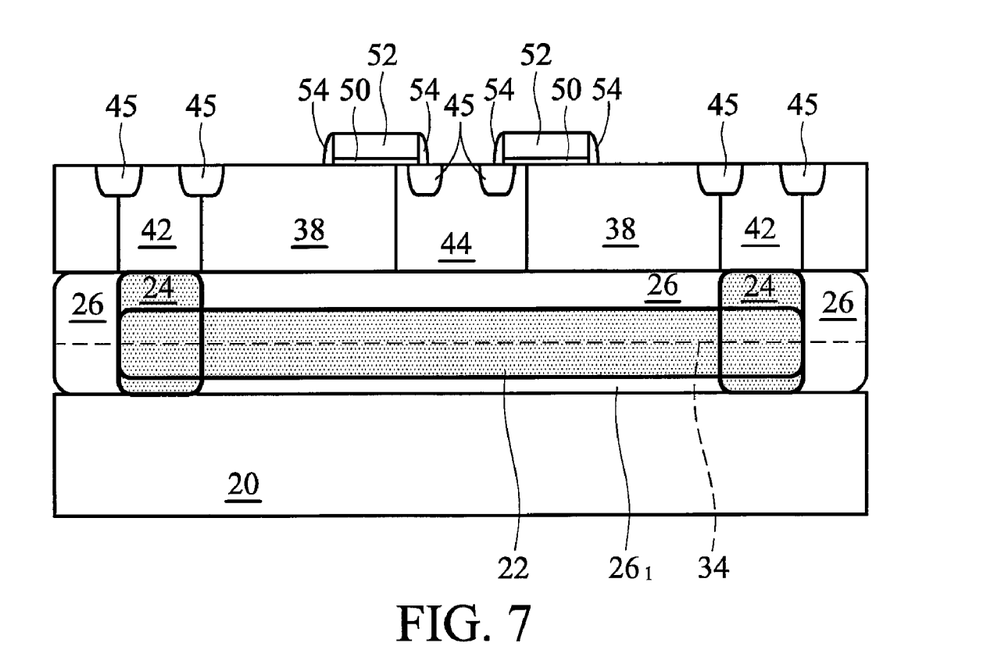

FIG. 7 illustrates the formation of gate dielectrics 50, gate electrodes 52 and spacers 54. The formation processes are well known in the art, and thus are not repeated herein. Lightly doped source regions (not shown) may also be formed. Preferably, side edges of gate electrodes 52 fall over STI regions 45.

Figure 8:
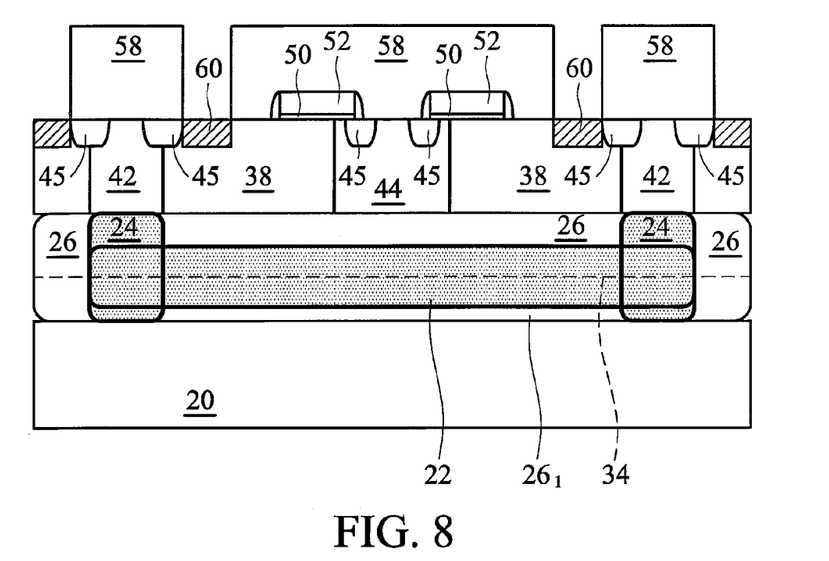

Referring to FIG. 8, photo resist 58 is applied and patterned. A p-type impurity implantation is performed, forming P+ regions 60. Preferably, P+ regions 60 are heavily doped to a high impurity concentration, for example, greater than about $10^{20}/cm^3$. In the described embodiments, heavily doped means an impurity concentration of above about $10^{20}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments. P+ regions 60 in HVPW regions 38 act as contact regions. Photo resist 58 is removed after the formation of P+ regions 60.

Figure 9:
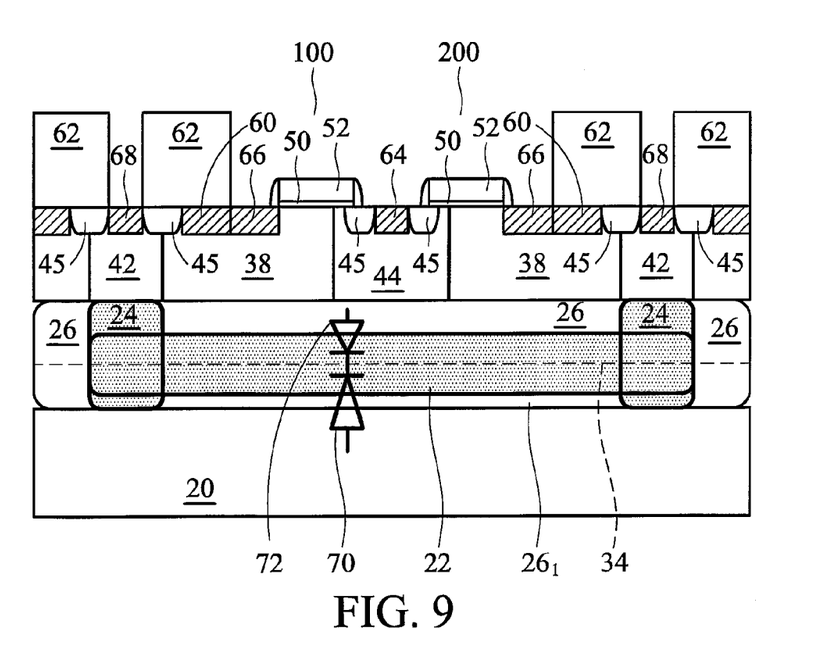

Photo resist 62 is then formed and patterned, as is shown in FIG. 9. An n-type impurity implantation is performed, forming drain region 64, source regions 66 and contact regions 68. Preferably, the n-type impurity is heavily doped. After the implantation, photo resist 62 is removed. One skilled in the art will realize that the order of forming N+ regions, P+ regions and gates is a matter of mere design choice.

Two HVNMOS devices 100 and 200 are thus formed. Preferably, source region 66 and gate 52 of HVNMOS device 100 are connected to the respective source region 66 and gate 52 of HVNMOS device 200, so that HVNMOS devices 100 and 200 act as a single device. Typically, an HVNMOS device may include more than one set of HVNMOS devices 100 and 200, wherein each of the sets is typically referred to as a leg. One skilled in the art will realize that a single leg or multiple legs of a HVNMOS device may be formed in the tub formed of NBL 22, N-ISO regions 24 and HVNW regions 42.

Figure 10:
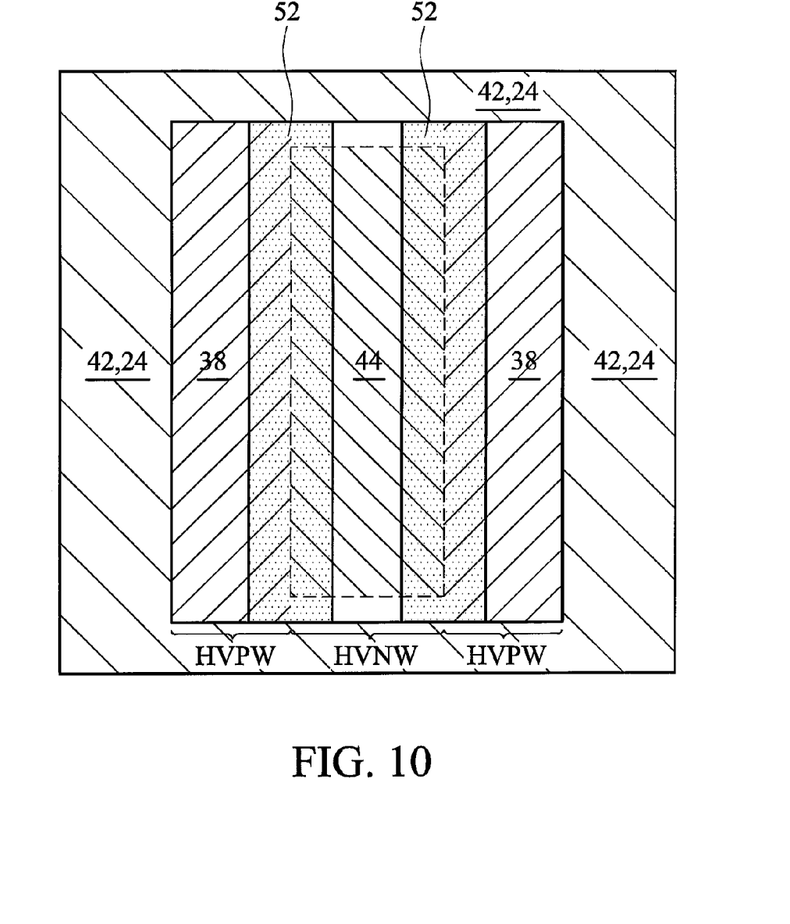
FIG. 10 illustrates a top view of an embodiment of the present invention.

FIG. 10 schematically illustrates a top view of the structure shown in FIG. 9. For simplicity, only HVPW regions, HVNW regions and gate electrodes are illustrated. FIG. 10 shows that HVNW 42 and N-ISO regions 24 form a ring encircling HVNW regions 38 and HVPW region 44. Therefore, the HVNMOS device formed in HVNW regions (ring) 42 is electrically isolated.

Referring back to FIG. 9, it is noted p-type substrate 20, NBL 22 and PBL 26 form two diodes 70 and 72, which are connected face-to-face. Therefore, one of the diodes 70 and 70 will be reverse biased, no matter the source-to-substrate, drain-to-substrate voltages are positive or negative.

The embodiments of the present invention have several advantageous features. The HVNMOS devices formed using the embodiments of the present invention can be applied with both positive and negative source/drain-to-substrate voltages without causing significant leakage currents and/or early breakdown. Since NBL 22 and PBL 26 (refer to FIG. 9) are formed before the formation of HVPW and HVNW regions (as compared to be implanted after the formation of epitaxial layer 32), it is easy to increase the impurity concentrations of NBL 22 and PBL 26. In an exemplary embodiment, NBL 22 may have an impurity concentration as high as about $10^{18}/cm^3$ or even higher. PBL 26 may have an impurity concentration of greater than about $10^{16}/cm^3$. As a result, parasitic bipolar transistors having either NBL 22 or PBL 26 as bases may have high base impurity concentrations. An example of such parasitic bipolar transistors is formed of substrate 20, NBL 22 and PBL 26. With high impurity concentrations, the base resistances are reduced, and base voltages are reduced accordingly. Parasitic bipolar transistors thus become harder to be turned on.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a semiconductor substrate;
   an n-type tub extending from a top surface of the semiconductor substrate into the semiconductor substrate, wherein the n-type tub comprises a bottom buried in the semiconductor substrate;
   a p-type buried layer (PBL) on a bottom of the tub, wherein the p-type buried layer is buried in the semiconductor substrate; and
   a high-voltage n-type metal-oxide-semiconductor (HVNMOS) device over the PBL and within a region encircled by sides of the n-type tub.

2. The semiconductor structure of claim 1, wherein the n-type tub has four sides each extending from the bottom of the tub upward substantially to the top surface of the semiconductor substrate, and wherein each of the sides comprises a first portion, and a second portion on the first portion, and wherein the first and the second portions have substantially discontinuous impurity concentrations.

3. The semiconductor structure of claim 2, wherein the first portions of the sides have a substantially higher impurity concentration that the bottom of the n-type tub.

4. The semiconductor structure of claim 2, wherein the first and the second portions have different widths.

5. The semiconductor structure of claim 1, wherein the n-type tub comprises four sides each extending from the bottom of the tub upward to the top surface of the semiconductor substrate; and wherein the sides and the bottom of the n-type tub have substantially different impurity concentrations.

6. The semiconductor structure of claim 1 further comprising:
   a high-voltage p-well (HVPW) region over the PBL;
   a high-voltage n-well (HVNW) region over the PBL;
   a gate dielectric extending from over the HVPW region to over the HVNW region;
   a gate electrode on the gate dielectric;
   a source region in the HVPW region and adjacent the gate electrode; and
   a drain region in the HVNW region and adjacent the gate electrode.

7. The semiconductor structure of claim 6, wherein the n-type tub comprises four sides having a same impurity concentration as the HVNW region.

8. The semiconductor structure of claim 1, wherein the PBL fully covers the bottom of the n-type tub.

9. A semiconductor structure comprising:
   a semiconductor substrate;
   a first high-voltage n-well (HVNW) region in the semiconductor substrate;
   a second HVNW region in the semiconductor substrate, wherein the first and the second HVNW regions are parallel;

a third HVNW region between the first and the second HVNW regions;
a first high-voltage p-well (HVPW) region between the first and the second HVNW regions;
a first and a second n-type isolation (N-ISO) region underlying and adjoining the first and the second HVNW regions, respectively;
an n-type buried layer (NBL) connecting the first and the second N-ISO regions; and
a p-type buried layer (PBL) on the NBL.

10. The semiconductor structure of claim 9, wherein the PBL extends horizontally beyond a region between the first and the second HVNW regions.

11. The semiconductor structure of claim 9, wherein the first and the second N-ISO regions have substantially different impurity concentrations from the first and the second HVNW regions.

12. The semiconductor structure of claim 9, wherein the first and the second N-ISO regions have substantially different impurity concentrations from the NBL region.

13. The semiconductor structure of claim 12, wherein the first and the second N-ISO regions have a substantially higher impurity concentration than the NBL region.

14. The semiconductor structure of claim 12, wherein the first and the second N-ISO regions have different widths from the first and the second HVNW regions.

15. The semiconductor structure of claim 12 further comprising;
a fourth and a fifth HVNW region; and
a third and a fourth N-ISO region underlying and adjoining the fourth and the fifth HVNW regions, respectively, wherein the first, the second, the fourth and the fifth HVNW regions form a ring, and wherein the first, the second, the third and the fourth N-ISO regions form a ring.

16. A semiconductor structure comprising:
a semiconductor substrate of a p-type conductivity;
an epitaxial layer on the semiconductor substrate;
an n-type buried layer (NBL) extending from the semiconductor substrate into the epitaxial layer;
a p-type buried layer (PBL) on the NBL;
an n-type isolation region (N-ISO) ring extending from the semiconductor substrate into the epitaxial layer, wherein the N-ISO ring encircles and adjoins the NBL and at least a portion of the PBL;
a high-voltage n-well (HVNW) ring on and adjoining the N-ISO ring; and
a high-voltage n-type metal-oxide-semiconductor (HVNMOS) device over the PBL, wherein a portion of the HVNMOS device in the epitaxial layer is encircled by the HVNW ring.

17. The semiconductor structure of claim 16, wherein the HVNMOS device comprises a source in a high-voltage p-well (HVPW) region, a drain in a high-voltage n-well (HVNW) region, and wherein the HVPW region and the HVNW region each have a bottom interface adjoining the PBL.

18. The semiconductor structure of claim 16, wherein the N-ISO ring has a higher impurity concentration than the NBL.

19. The semiconductor structure of claim 16, wherein the N-ISO ring has a different impurity concentration from the HVNW ring.

20. The semiconductor structure of claim 16 further comprising a p-type region between the NBL and the semiconductor substrate, wherein the p-type region has a higher p-type impurity concentration than the semiconductor substrate.

* * * * *

UNITED STATES PATENT AND TRADEMARK OFFICE
CERTIFICATE OF CORRECTION

| | | |
|---|---|---|
| PATENT NO. | : 7,843,002 B2 | |
| APPLICATION NO. | : 11/773365 | |
| DATED | : November 30, 2010 | |
| INVENTOR(S) | : Wei et al. | |

It is certified that error appears in the above-identified patent and that said Letters Patent is hereby corrected as shown below:

In Col. 6, line 36, claim 3, delete "that" and insert --than--.

Signed and Sealed this
Twenty-fifth Day of January, 2011

David J. Kappos
*Director of the United States Patent and Trademark Office*